(12) United States Patent
Suijver et al.

(10) Patent No.: US 9,097,752 B2
(45) Date of Patent: Aug. 4, 2015

(54) MAGNETIC FIELD PROBE SEALED WITH A METALLIC PLUG (71) Applicant: KONINKLIJKE PHILIPS N.V., Eindhoven (NL)

(72) Inventors: Jan Frederik Suijver, Eindhoven (NL); Johannes Wilhelmus Weekamp, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/379,603

(22) PCT Filed: Feb. 22, 2013

(86) PCT No.: PCT/IB2013/051462
§ 371 (c)(1),
(2) Date: Aug. 19, 2014

(87) PCT Pub. No.: WO2013/128355
PCT Pub. Date: Sep. 6, 2013

(65) Prior Publication Data
US 2015/0028871 A1    Jan. 29, 2015

Related U.S. Application Data (60) Provisional application No. 61/603,406, filed on Feb. 27, 2012.

(51) Int. Cl.
G01R 33/06    (2006.01)
G01R 3/00     (2006.01)
G01R 33/28    (2006.01)
G01R 33/30    (2006.01)
G01R 33/24    (2006.01)
G01R 33/565   (2006.01)

(52) U.S. Cl.
CPC ........ *G01R 33/06* (2013.01); *G01R 3/00* (2013.01); *G01R 33/28* (2013.01); *G01R 33/30* (2013.01); *G01R 33/243* (2013.01); *G01R 33/56563* (2013.01)

(58) Field of Classification Search
CPC ...... G01R 33/06; G01R 33/243; G01R 33/28; G01R 33/30; G01R 33/56563; G01R 3/00
USPC ............................ 324/300–322, 244; 29/601
See application file for complete search history.

(56) References Cited

U.S. PATENT DOCUMENTS 5,346,672 A    9/1994  Stapleton
5,684,401 A   11/1997  Peck
(Continued)

OTHER PUBLICATIONS

Sipila, Pekka et al "2H Transmit-Receive NMR Probes for Magnetic Field Monitoring in MRI", Magnetic Resonance in Medicine, vol. 65, May 2011, pp. 1498-1506.

*Primary Examiner* — Melissa Koval
*Assistant Examiner* — Rishi Patel (57) ABSTRACT The invention provides for a magnetic field probe (100, 2202) comprising a container (104, 702, 1400, 1500, 1600, 1700, 1800) with a hollow cavity (106, 602). The hollow cavity comprises a duct (110, 700) connecting the hollow cavity with an exterior surface (109, 702) of the container. The container further comprises metallization (108, 800) surrounding the duct on the exterior surface. The container further comprises a metallic plug (400, 1000). The metallic plug at least partially fills the duct. The metallic plug forms a seal (402, 1002) with the metallization. The magnetic field probe further comprises a sample (300, 900, 1608) comprising fluorine 19. The sample at least partially fills the hollow cavity. The magnetic field probe further comprises an antenna (102) adjacent to the container for manipulating the magnetic spins of the fluid sample and for receiving magnetic resonance signals from the fluid sample.

15 Claims, 10 Drawing Sheets

(56) References Cited

U.S. PATENT DOCUMENTS

| | | |
|---|---|---|
| 7,919,308 B2 | 4/2011 | Schleifer |
| 2009/0295389 A1 | 12/2009 | Pruessmann |
| 2010/0156414 A1* | 6/2010 | Sakellariou et al. .......... 324/309 |
| 2011/0041520 A1* | 2/2011 | Erne et al. ..................... 62/51.1 |

* cited by examiner

FIG. 22

MAGNETIC FIELD PROBE SEALED WITH A METALLIC PLUG

CROSS-REFERENCE TO PRIOR APPLICATIONS

This application is the National Phase application under 35 U.S.C. §371 of International Application No. PCT/IB2013/051462, filed on Feb. 22, 2013, which claims the benefit of U.S. Provisional Patent Application No. 61/603,406, filed on Feb. 27, 2012. These applications are hereby incorporated by reference herein.

TECHNICAL FIELD

The invention relates to magnetic field probes for magnetic resonance imaging, in particular to the sealing of a sample into the magnetic field probe.

BACKGROUND OF THE INVENTION

During magnetic resonance imaging the magnetic field may vary during the acquisition of the magnetic resonance image. For instance the switching of the magnetic field gradients may introduce unwanted magnetic field variations. The placement of foreign objects or even the presence of tissue may affect the static magnetic field also. Magnetic measurements may be used for correcting for unwanted magnetic field variations.

A magnetic field probe is a probe or sensor which enables the measurement of spatio-temporal variations in a magnetic field. A magnetic field probe may be constructed by taking a material which has a known Nuclear Magnetic Resonance (NMR) signal. The frequency of specific NMR resonances is a function of the magnetic field. In NMR spectrometers, the magnetic field strength is known and in this way a spectrum may be used to identify the sample. For a magnetic field probe the reverse is true. A known material is placed into a magnetic field of an unknown strength, the spectra or the location of a particular resonance or resonances may then be used to determine the magnetic field strength.

United States patent application US 2009/0295389 A1 discloses a magnetic field probe and a method of manufacturing it.

SUMMARY OF THE INVENTION

The invention provides for a magnetic field probe, a magnetic resonance imaging system and a method of manufacturing a field probe in the independent claims. Embodiments are given in the dependent claims.

In clinical Magnetic Resonance Imaging (MRI) it is a problem that the local magnetic fields are not exactly known, due to environmental influences. The envisaged solution is to continuously measure actual field on a number of locations within the magnet using a so-called field probe. The main problem is that the field probe contains liquid which keeps escaping and/or evaporating, typically within a few months. Magnetic field probes typically comprise Fluorocarbons such as perfluorinated hydrocarbons for generating the Nuclear Magnetic Resonance (NMR), or MRI, signal used in determining the magnetic field strength. A difficulty in using many Fluorocarbons is that they are extremely slippery and tend to evaporate easily. As mentioned above, it may be difficult to seal the Fluorocarbons into the magnetic field probe for a long period of time. This problem may result in either needing to replace the fluorocarbons in the field probe or the entire field probe at regular intervals.

Embodiments of the invention may solve this aforementioned problem and others by providing for a field probe which comprises a container with a hollow cavity. The hollow cavity is filled with a fluid sample comprising an atomic species with an atomic spin. There is a duct through the call of the container into the hollow cavity. On the outside surface of the hollow cavity there is a metallization surrounding the duct. A metal plug is then used to at least partially fill the duct. The metal plug further forms a seal with the metallization. This seal may reduce the evaporation and/or loss of the fluid sample from the hollow cavity. This may provide the field probe which is able to be used longer.

A 'magnetic field probe' or 'field probe' as used here encompasses a probe or sensor which enables the measurement of spatio-temporal variations in a magnetic field. A magnetic field probe may be constructed by taking a material which has a known NMR, or MRI, signal. The frequency of specific NMR resonances is a function of the magnetic field. In NMR spectrometers, the magnetic field strength is known and in this way a spectrum may be used to identify the sample. For a magnetic field probe the reverse is true. A known material is placed into a magnetic field of an unknown strength, the spectra or the location of a particular resonance or resonances may then be used to determine the magnetic field strength.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network.

'Computer memory' or 'memory' is an example of a computer-readable storage medium. Computer memory is any memory which is directly accessible to a processor. Examples of computer memory include, but are not limited to: RAM memory, registers, and register files.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa.

A 'computing device' as used herein encompasses to any device comprising a processor. A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals, also referred to as MRI signals, MR signals, or NMR signals, emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic field probe for a magnetic resonance imaging system. The magnetic field probe comprises a container with a hollow cavity. The hollow cavity comprises a duct connecting the hollow cavity with an exterior surface of the container. The container further comprises metallization surrounding the duct on the exterior surface. The container further comprises a metallic plug. The metallic plug at least partially fills the duct. The metallic plug forms a seal with the metallization. That is to say there is a hole in the container which provides access to the hollow cavity. Surrounding the entrance to the hole is metallization which is adhered or attached to the surface of the container surrounding the hole. There is then a metal plug which at least partially fills the hole and forms a seal on the metallization. The magnetic field probe further comprises a sample comprising fluorine 19. The sample at least partially fills the hollow cavity. The magnetic field probe further comprises an antenna adjacent to the container for manipulating the magnetic spins, or atomic spins, of the fluid sample and for receiving magnetic resonance data from the fluid sample.

This embodiment may be advantageous because the metallic plug forms a good seal with the metallization. Typical magnetic field probes which use fluorine 19 samples may have the problem that the fluorine 19 liquid or material is very slippery and hard to contain within a container. The use of a metallic plug sealing against a metallization may provide a means of sealing the fluorine 19 within the magnetic field probe such that the useful life of the magnetic field probe may be longer.

A 'metallization' as used herein encompasses the deposit of a thin film or layer of metal on a non-metallic surface. For instance the metallization could be deposited on the surface surrounding a duct in any number of ways. The use of a plasma to sputter a metal to form metallization is one way of doing this. Another way is using electron beam evaporation or thermal evaporation to create a vapor metal which then condenses to form the metallization around the duct. A mask or other similar structure may be used to shape the metallization such that the entire container is not coated.

In one embodiment the fluid sample is a liquid. It for instance may be a liquid at room temperatures or typical temperatures which may be used for operating the magnetic resonance imaging system.

In another embodiment the metallization is chromium as a start of the adhesion layer followed by nickel and followed by gold. The gold may be used for a gold bonding process between the metallic plug and the gold. In another embodiment the metallization may be aluminum. This metal may be used for adhering to the surface of the container and may be used for gold bonding and is also magnetic resonance imaging compatible.

In another embodiment the metallization comprises a layer of titanium.

In another embodiment the metallization is formed by stacks of different metals deposited at different times. For instance titanium, chromium, nickel, and gold may be used in varying stacks. In some embodiments the metallization is annealed in an annealing oven before the metallic plug is sealed to it.

In another embodiment the container is fabricated from a dielectric material.

In another embodiment the container is a rigid container. This embodiment may be beneficial because it provides a hollow cavity with a known shape and size. This may be used for evaluating the strength of the magnetic resonance signal detected by the antenna.

In another embodiment the container is a hermetically sealed structure. The use of a hermetically sealed structure may be beneficial because it may prevent the leaking of the fluid sample. A hermetic seal as used herein encompasses a seal that is impervious to the flouring 19 sample.

In another embodiment the hollow cavity contains a bubble in a sample for relieving expansion and contraction of the fluid sample. This embodiment may be beneficial because if there is a large temperature change the fluid sample may expand or contract. If the fluid sample expands too much there may be the possibility that the pressure would burst open the metallic plug.

In another embodiment a portion of the hollow cavity is coated with a coating for maintaining a preferred bubble location of the bubble. For instance the coating may be deposited in the portion of the hollow cavity where it is desired that the bubble is located. In some embodiments this coating may be a hydrophilic coating. Although the sample is not necessarily water-based the coating may change the surface tension such that the bubble prefers to be in a location where the coating is.

In another embodiment the coating is any one of the following: Teflon, AF-1600, and parylene. This embodiment may be beneficial because if the bubble is located at a preferred location the magnetic resonance signal from the sample will be more predictable. For instance if the bubble changes location with respect to the antenna it may affect the level of the signal. Also if the magnetic probe experiences a magnetic gradient through the sample different regions of the sample may contribute a different frequency component to the magnetic resonance signal. Having the bubble at a preferred bubble location may make the results from the magnetic field probe more predictable and reliable.

In another embodiment the container is at least partially made from quartz.

In another embodiment the container is at least partially made from alumina.

In another embodiment the container comprises a bellows at least partially within the hollow cavity for relieving thermal expansion and contraction of the fluid sample. This embodiment may be beneficial because the bellows has the same function as a bubble within the hollow cavity. The bellows may be able to expand and contract and in this way may help to prevent the metallic plug from being burst by too high a pressure.

In another embodiment the bellows may be within the hollow cavity. In this embodiment a bellows may be sitting completely within the hollow cavity.

In other embodiments the bellows could form a portion of the hollow cavity's wall. For instance a portion of the wall or interior wall of the hollow cavity may be a flexible or bellows-like material. In yet another embodiment the hollow cavity may be formed by a dielectric portion and another portion of a container it may be formed by the bellows.

In another embodiment at least a portion of the container forming the hollow cavity comprises at least one flexible element for relieving expansion and contraction of the fluid sample. This embodiment may be advantageous because the flexible element may provide some pressure release to prevent the pressure from bursting the seal that the metallic plug forms with the metallization.

In another embodiment the container is completely filled with the fluid sample. That is to say there is no bubble and the flexible element provides pressure release.

In another embodiment the container is formed by walls. The flexible element is a portion of a wall of the container.

In another embodiment the container is formed by walls. The flexible element is formed by all walls of the container.

In another embodiment the flexible element is a bellows.

In another embodiment the bellows is fabricated from metal or comprises metal. There may be a metal-to-glass or metal-to-alumina seal to attach the metal bellows to the glass, alumina, or quartz.

In another embodiment the container is made at least partially of glass, alumina, or quartz.

In another embodiment the atomic species is Hydrogen.

In another embodiment the atomic species is Deuterium.

In another embodiment the atomic species is Fluorine 19.

In another embodiment, the sample comprises any one of the following: a perfluorinated hydrocarbon; hexafluorobenzene; hexafluoro-2,3-bis(trifluoromethyl)butane-2,3-diol; hexafluoro-2-propanol; 2,2,2-trifluoroethanol; 3,3,3-trifluoro-1-propanol; trifluoroacetic acid; hexafluorobenzene; perfluoro 15-crown-5; and combinations thereof.

In another embodiment the sample comprises at least one dopant admixed to the MR active substance. The dopant is a complex of a divalent or trivalent metal cation with two or three equivalents, respectively, of a charge neutralizing ligand. The ligand is selected from the group consisting of: acetylacetonate, 6,6,7,7,8,8,8-heptafluoro-2,2-dimethyl-3,5-octanedionate, hexafluoroacetylacetonate, acetate, tetramethylcyclopentadienyl, propoxide, and 2,2,6,6-tetramethyl-5 3,5-heptanedionate. The metal cation is selected from the group comprising: Fe, Mn, Cr, Co, Ni, Cu, or anyone of the rare earth metals.

In another embodiment the sample comprises perfluoropinacol. The use of perflororpinacol may be beneficial, because it contains a high fluorine 19 density.

In another embodiment the metallic plug comprises any one of the following: gold, indium, platinum, palladium, and combinations thereof.

In another embodiment the outer dimensions of the field probe are less than 1 cm in all directions.

In another embodiment the sample is no larger than 1 mm in all directions. Its geometry should be mainly fixed, but there are no strong requirements on its precise shape.

In another embodiment the magnetic field probe is permanently sealed. Preferably it will then have a useful life time of at least 10 years.

In another embodiment the magnetic field probe should remains sealed during temperature variations ($-20°$ C. to $+80°$ C. in accordance with standard CE-label requirements).

In another embodiment the conductive wires or antenna, probably 8 or more loops of wire, for measuring the field should be less than 1 mm away from the sample.

In another embodiment the container material should be non-conductive. The container may be a dielectric.

In another embodiment there is a vapor and/or air pocket present in the sealed fluid container. The vapor and/or air pocket may be called a bubble. The bubble's volume is preferably less than 10% of the total volume during operation, at 15° C. to 30° C. It is also preferable if the location of the bubble within the hollow cavity remains constant.

In another aspect the invention provides for a magnetic resonance imaging system comprising a magnetic for providing an imaging zone. The magnetic resonance imaging system further comprises a radio-frequency transceiver. The magnetic resonance imaging system further comprises a magnetic field probe according to an embodiment of the invention. The field probe is connected to the radio-frequency transceiver. The field probe is located within the imaging zone. The imaging zone as used herein encompasses a region with a magnetic field that is sufficiently strong and uniform enough to perform magnetic resonance imaging. This embodiment may be advantageous because a magnetic field probe according to an embodiment of the invention may last longer than a conventional magnetic field probe using fluorine. This may enable the magnetic resonance imaging system to operate or function for a longer period of time without having to service the magnetic field probe.

In another embodiment the magnetic resonance imaging system further comprises a processor for controlling the magnetic resonance imaging system. The magnetic resonance imaging system further comprises a memory for storing machine-executable instructions. Execution of the instructions causes the processor to acquire magnetic resonance data using the magnetic resonance imaging system. Execution of the instructions further causes the processor to calculate a magnetic field strength using the magnetic resonance data.

In another embodiment execution of the instructions further cause the processor to acquire image magnetic resonance data from a subject using the magnetic resonance imaging system. Execution of the instructions further cause the processor to calculate corrected magnetic resonance data using the magnetic field strength and the image magnetic resonance data. Execution of the instructions further causes the processor to reconstruct an image from the corrected magnetic resonance data.

The actions performed by the processor upon execution of the instructions in the aforementioned embodiments may also be used as the steps in a method. The machine-executable instructions which are executed by the processor in the previous embodiments may also be stored as a computer program product. The computer program product may for instance be stored on a non-transitory computer-readable medium.

In another aspect the invention provides for a method of manufacturing a magnetic field probe. The method comprises the step of providing a container with a hollow cavity. The hollow cavity comprises a duct connecting the hollow cavity with an exterior surface of the container. The container further comprises a metallization surrounding the duct on the exterior surface. The method further comprises the step of filling the hollow cavity at least partially with a fluid sample comprising an atomic species with an atomic spin. The container comprises an antenna adjacent to the container for manipulating the magnetic spins, or atomic spins, of the sample and for receiving magnetic resonance data from the fluid sample. In some embodiments the antenna is already adjacent to the hollow cavity of the container. In other embodiments the method further comprises the step of providing the antenna and attaching the antenna to the container.

The method further comprises the step of filling the duct at least partially with a metallic plug. The metallic plug forms a seal with the metallization.

In another embodiment the seal between the metallic plug and the metallization is formed using thermosonic bonding. The use of thermosonic bonding is known from the bonding of metal conductors to metallizations on semi-conductors. A machine which both presses the metallic plug into place and then exerts pressure while being vibrated ultrasonically may be used for performing the thermosonic bonding.

In another embodiment the sample is a fluid.

In another embodiment the hollow cavity is performed by performing the step of placing the container in a vacuum. The hollow cavity is further filled by performing the step of submersing the duct in the sample. The sample may be a fluid and may be boiling after air or the atmosphere surrounding the container and the sample has been evacuated. The filling of the hollow cavity is further performed by venting the vacuum to atmospheric pressure. The duct is filled with the metallic plug after venting the vacuum. Because the container has been placed into a vacuum all of the air or other gasses within the hollow cavity have been evacuated. Placing the duct into a fluid sample and then venting the vacuum to atmospheric pressure causes the sample or fluid to enter into the hollow cavity filling it. With the sample now at least partially filling the hollow cavity the duct is filled with a metallic plug thus sealing it.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
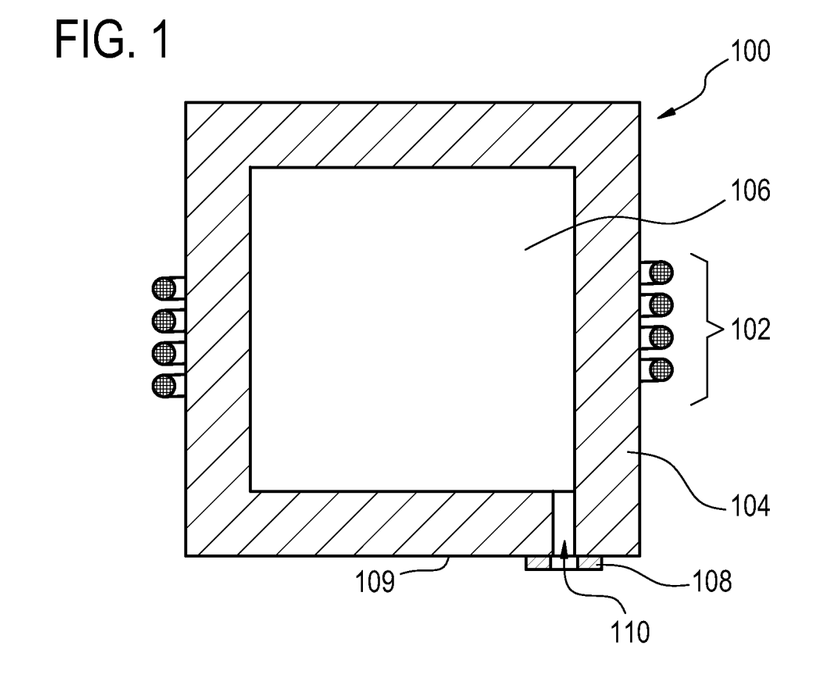
FIG. 1 illustrates a magnetic field probe according to an embodiment of the invention.

FIG. 1 shows a magnetic field probe 100 according to an embodiment of the invention. In FIG. 1 the magnetic field probe 100 has not yet been filled with the fluid sample. The magnetic field probe 100 comprises a container 104 surrounded by an antenna 102. The view shown in FIG. 1 is a cutaway or sectional view. The container 104 has a hollow cavity 106. The container 104 has an outer surface 109. There is a duct 110 which connects the outer surface 109 to the hollow cavity 106. The duct 110 may be used to fill the container 104 with the fluid sample. There is a metallization 108 on the exterior surface 109 surrounding the duct 110. The metallization 108 is later used for forming a seal for closing the duct 110.

Figure 2:
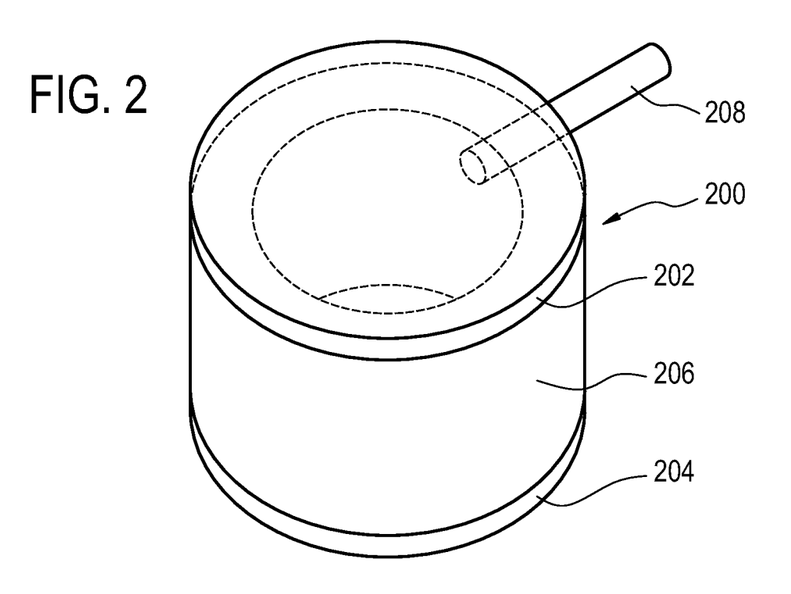
FIG. 2 illustrates an example of a container which may be used for constructing a magnetic field probe

FIG. 2 shows an example of a container 200 which may be used for constructing a magnetic field probe. The container is formed from an upper plate 202, a lower plate 204 and a cylinder 206. The upper plate 202 and the lower plate 204 are hermetically sealed onto both ends of the cylinder 206. No antenna or coil is shown in this Fig. Also shown in this FIG. 2 is an optional connector 208 which allows a tube to be connected to the container 200. The duct is on the lower plate 204 and is not visible in this Fig.

Figure 3:
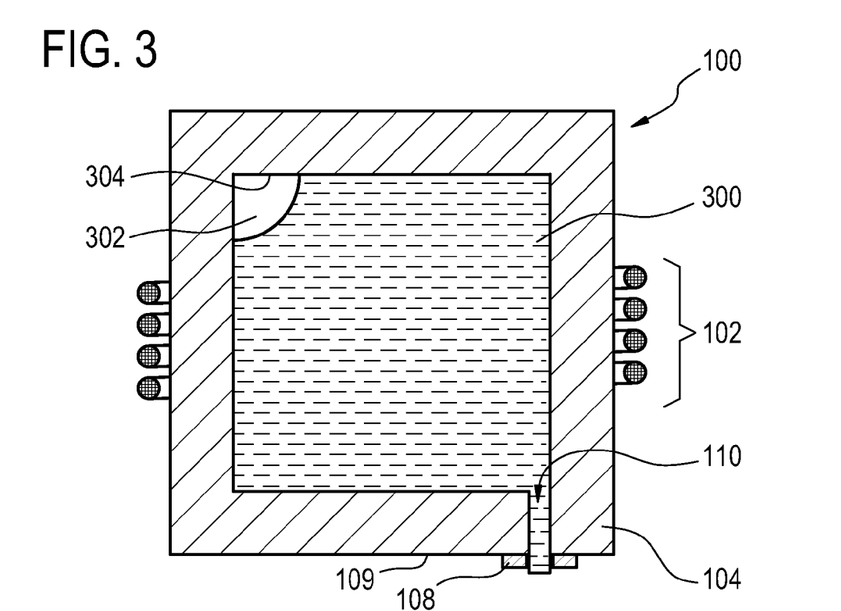
FIG. 3 illustrates how the magnetic field probe of FIG. 1 is filled with a fluid sample.

FIG. 3 is used to illustrate how the magnetic field probe 100 is filled with a fluid sample 300. As shown in this Fig. the hollow cavity is now shown as being filled with a fluid sample 300 with the exception of a bubble 302. In some embodiments there may be a coating on the surface 304 where the bubble 302 contacts the container 104. Material on the surface 304 may be used to make the bubble 302 go into a preferential location or spot. In this example the duct 110 has not yet been sealed.

The sample 300 has a vapor pressure. If the hollow cavity is filled at a temperature above the freezing point, a vapor bubble 302 remains in the container.

Following the filling of the container, the vapor bubble 302 will remain fixed to the wall of the container due to the dominance of interfacial forces (between liquid/vapor/wall) over gravity. If desired, the location where the vapor bubble is positioned can be enforced by locally modifying the interfacial tension of the inside of the hollow cavity or hermetically sealed structure. This can be achieved through the application of a coating, e.g., Teflon, AF-1600, parylene, etc.

Figure 4:
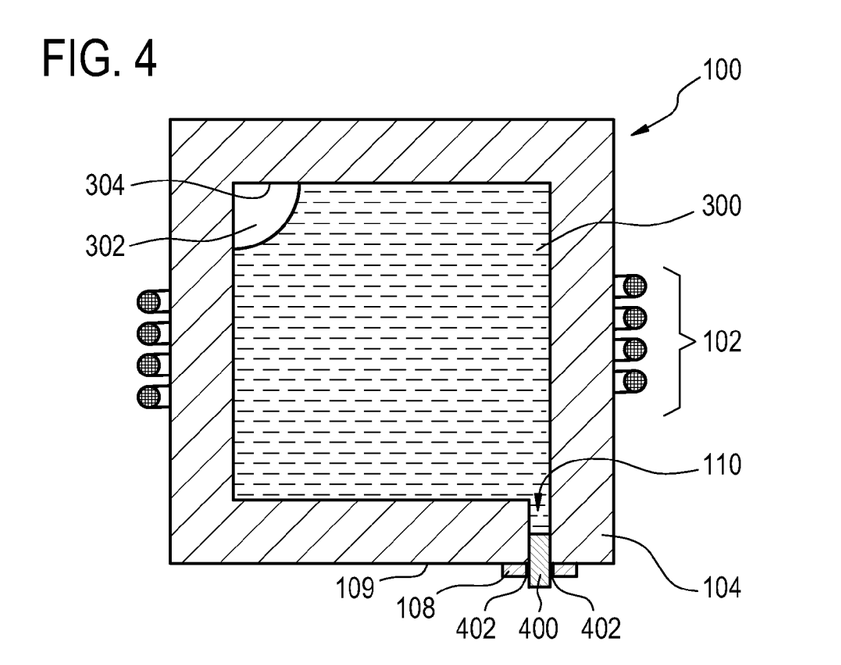
FIG. 4 illustrates the magnetic field probe of FIG. 1 after the duct has been sealed.

FIG. 4 illustrates the magnetic field probe 100 after the duct 110 has been sealed. The duct 110 has been partially filled with metallic plug 400. The metallic plug 400 forms a seal 402 with the metallization 108.

Figure 5:
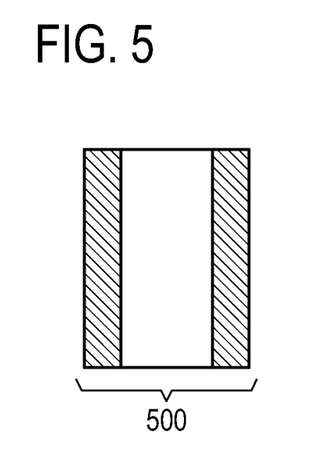
FIGS. 5-10 illustrate the manufacture of a magnetic field probe with a flexible container.

The final step illustrated in FIG. 4 is to seal off the duct 110 between the internal 300 and external volumes 109. This is achieved by injecting a deformable material 400 such as a metal plug made of, e.g.: indium or gold, into the channel and subsequently ultrasonically bonding this material to the metallization/sealing substrate 108 located on the outside of the hermetically sealed structure. The final state will look as follows:

FIGS. 5-10 illustrate the manufacture of a magnetic field probe with a flexible container. Shown in FIG. 5 is a rectangular structure or box 500. The views in FIGS. 5-11 are cross-sectional. In an alternative embodiment the structure 500 is a tube.

In this embodiment, the casing of the container itself is flexible.

Figure 6:
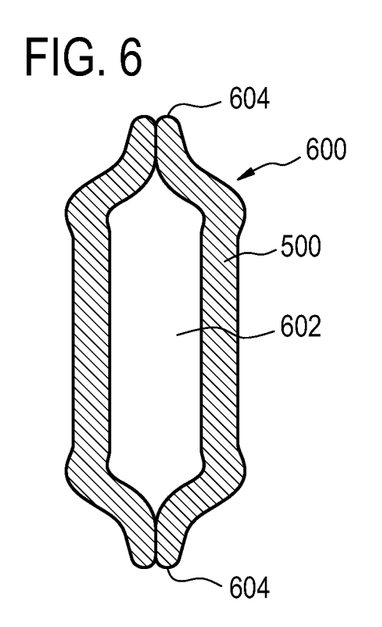

Use standard glass/sintering techniques may be used to completely seal the container. Techniques such as those known from metal halide lamp manufacturing can be done accurately with a very good sealing capacity:

In FIG. 6 the box 500 has its ends crimped together to form a container 600. The container 600 is now sealed and has a hollow cavity 602. A crimped end 604 on either end of the box 500 seals the container 600.

Figure 7:
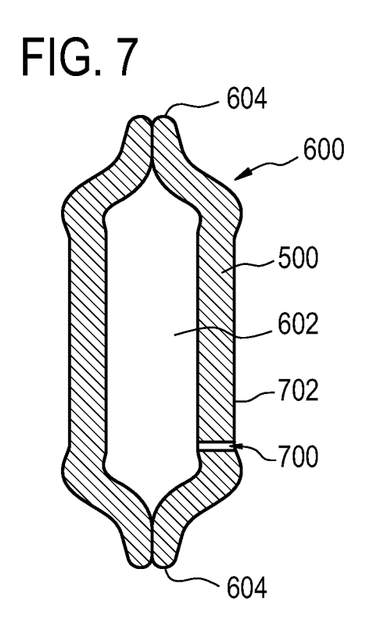

The next step of the process is shown in FIG. 7. In FIG. 7 a duct 700 has been cut through the container 600. The duct 700 forms a port between the hollow cavity 602 and an exterior surface 702 of the container 600.

Figure 8:
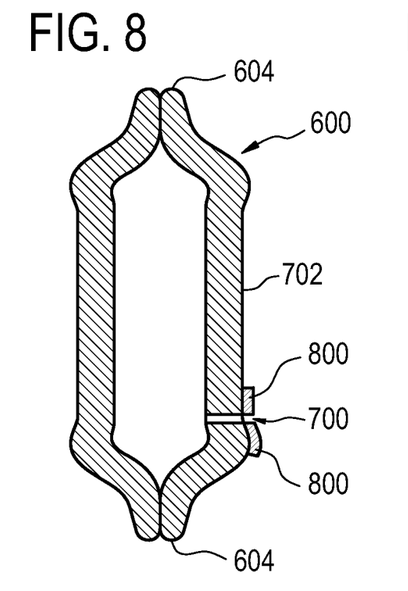
Figure 9:
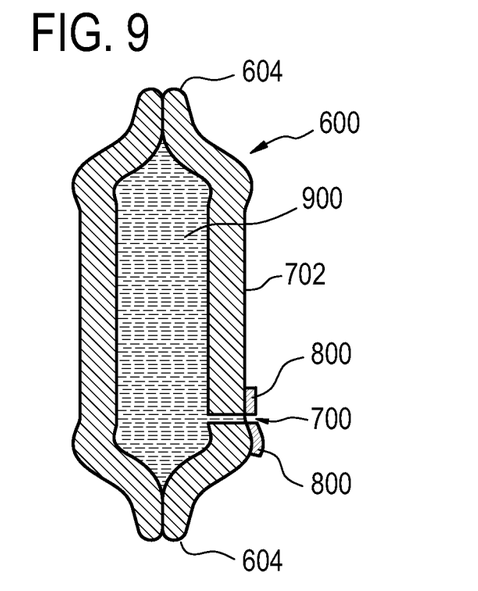

The next step of the manufacturing process is shown in FIG. 8. In FIG. 8 a metallization 800 has been deposited on the exterior surface 702 surrounding the duct 700. In FIG. 9 the container 600 has had its hollow cavity filled with a fluid sample 900. The container 600 may be filled with a fluid sample for instance using the previously described vacuum technique.

Figures 10, 11:
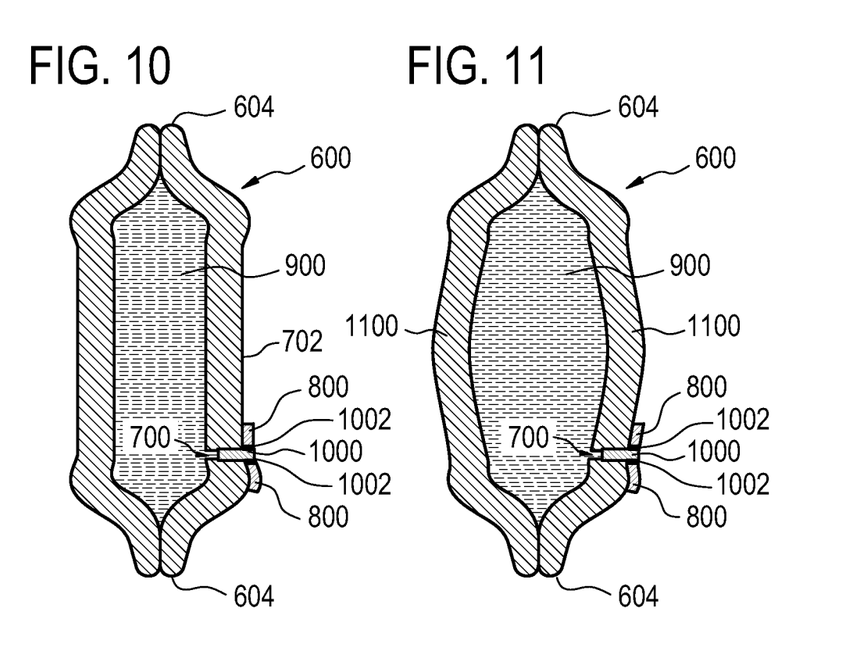
FIG. 11 shows the finished magnetic field probe of FIG. 10 with bulging walls.

In FIG. 10 the duct 700 is shown as being filled at least partially with the metallic plug 1000. The metallic plug 1000 forms a seal 1002 with the metallization 800. With the addition of a coil or antenna the embodiment shown in FIG. 10 would be a complete magnetic field probe.

FIG. 11 shows the same embodiment as shown in FIG. 10 except in this case the pressure of the fluid sample 900 relative to the pressure exterior to the container 600 is higher than shown in FIG. 10. Instead of the plug 1000 bursting out there are bulging walls 1100 which are able to provide a pressure release.

Figure 12:
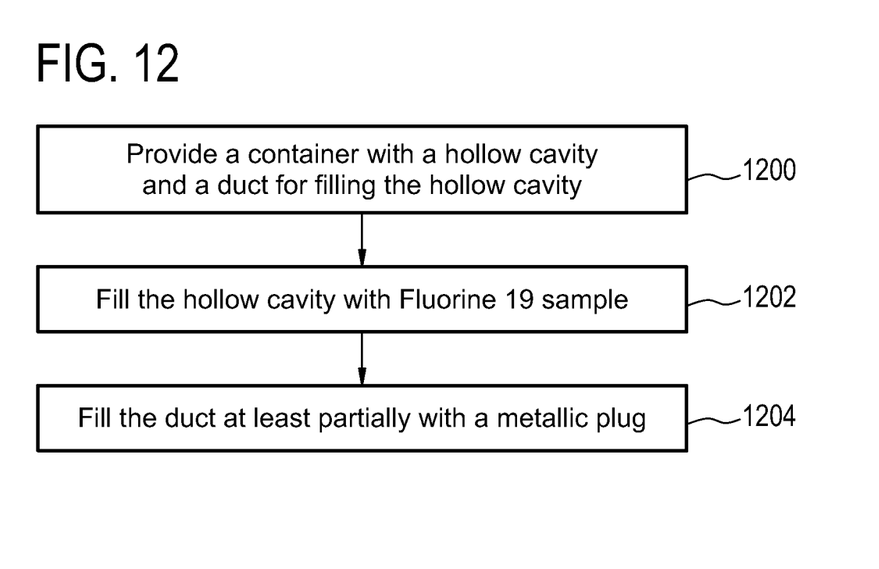
FIG. 12 shows a flowchart which illustrates a method of manufacturing a magnetic field probe according to an embodiment of the invention.

FIG. 12 shows a flowchart which illustrates a method of manufacturing a magnetic field probe according to an embodiment of the invention. In step 1200 a container with a hollow cavity and a duct for filling the hollow cavity is provided. Next in step 1202 the hollow cavity is filled with a fluid sample comprising an atomic isotope or species with an atomic or magnetic spin. In step 1204 the duct is filled at least partially with a metallic plug to seal it.

Figure 13:
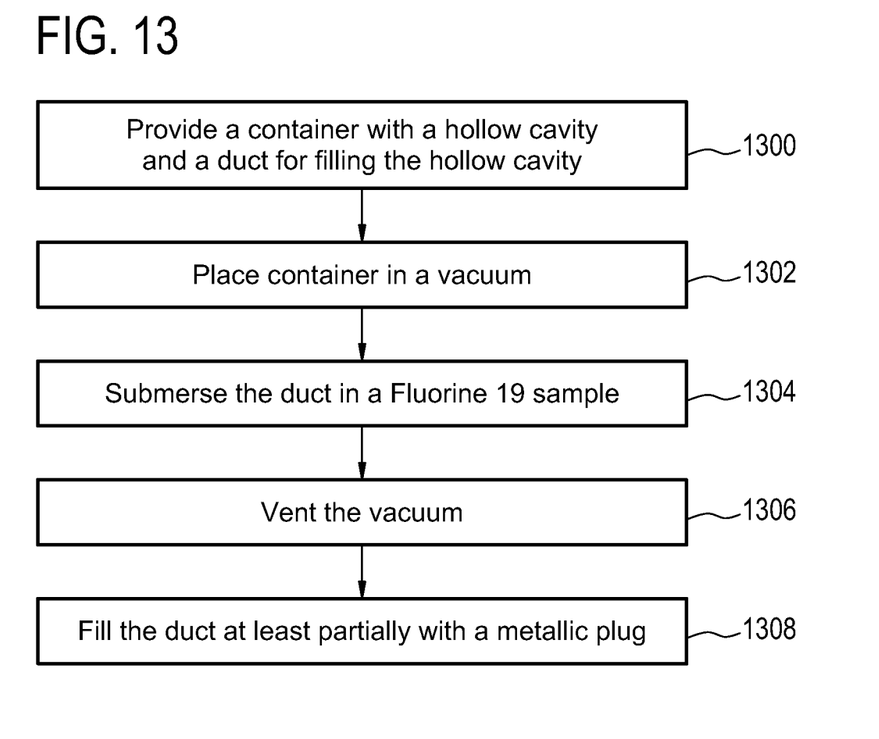
FIG. 13 shows a flow diagram which illustrates a method of manufacturing a magnetic field probe according to a further embodiment of the invention.

FIG. 13 shows a flow diagram which illustrates a method according to a further embodiment of the invention. In step 1300 a container is provided with a hollow cavity and a duct for filling the hollow cavity. Next in step 1302 the container is placed into a vacuum. This may be for instance putting the container within a vacuum chamber and evacuating the vacuum chamber. Next in step 1304 the duct is submersed into a fluid sample comprising an atomic isotope or species with an atomic or magnetic spin. The terms atomis and magnetic spin are used interchangeably herein. The fluid sample is also within the vacuum. It should be noted that the fluid sample may be boiling because of the vacuum. Next in step 1306 the vacuum is vented. All of the air and gas of the hollow cavity was evacuated when it was placed into a vacuum. Therefore when the vacuum is vented the pressure coming back into the vacuum chamber causes the fluid sample to flow into the hollow cavity of the container. Finally in step 1308 the duct is at least partially filled with a metallic plug. This seals the duct preventing the fluid sample from leaving or escaping.

Figure 14:
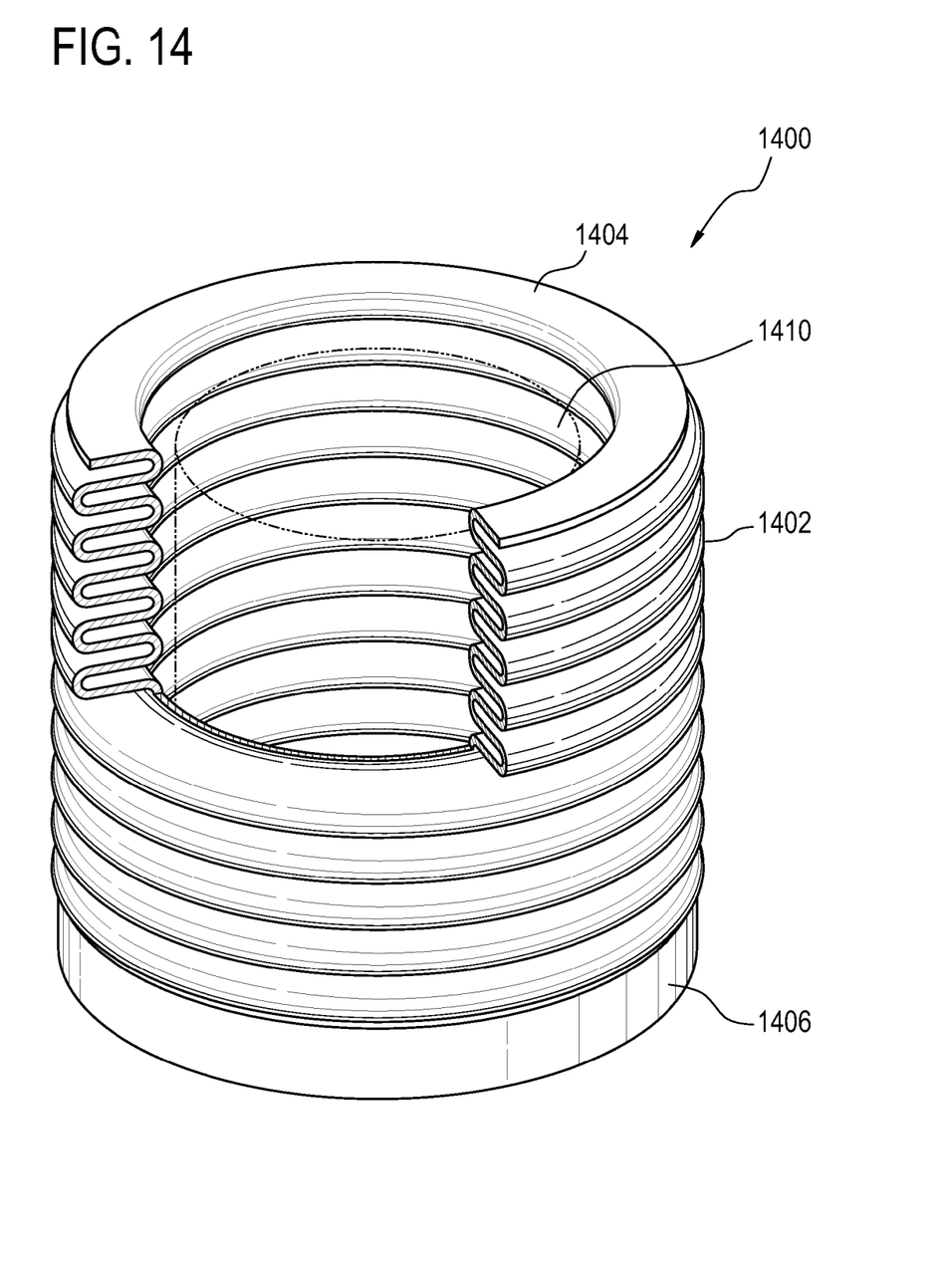
FIG. 14 illustrates a container according to an embodiment of the invention.

FIG. 14 illustrates a container 1400 according to an embodiment of the invention. The container 1400 is constructed from a bellows 402. On the top end there is a place 1404 for a top plate which is not shown. The bottom portion of the bellows 402 is sealed by a bottom plate 1406. The bottom plate may contain the duct and metallization for filling. This is not shown in this Fig. The bellows 1402 are flexible in order to deal with the expansion of the fluid as a function of temperature. The bellows connect to a top plate and bottom plate 1406 to form hermetic seals. There is a hollow cavity 1410. In this embodiment a surface coil may for instance be placed on the top plate or bottom plate 1406.

Figure 15:
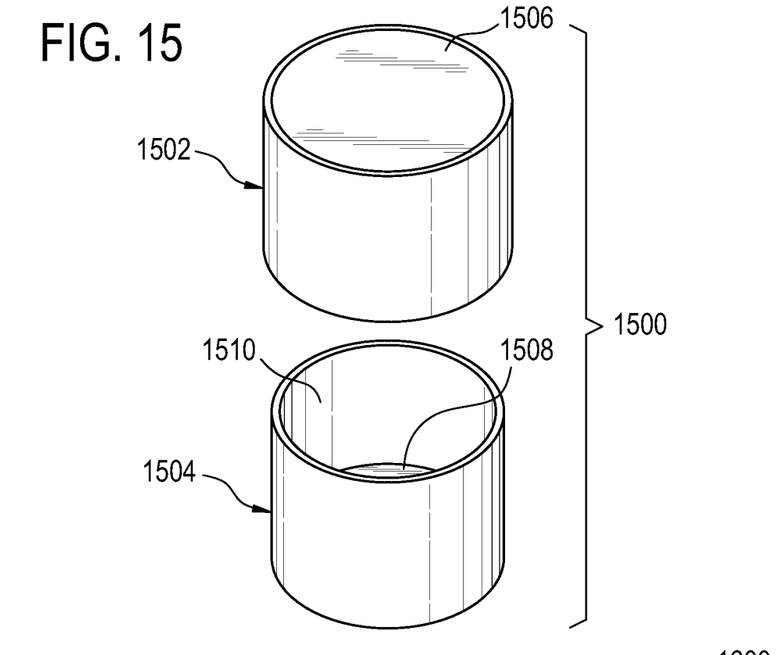
FIG. 15 illustrates an alternative container according to a further embodiment of the invention.

FIG. 15 shows an alternative embodiment of a container 1500 according to an embodiment of the invention. There is a first tube 1502 and a second tube 1504. The second tube 1504 is able to slide within the first tube 1502. The first tube 1502 has one end sealed with a top plate 1506. The first tube 1502 and the top plate 1506 form a hermetic seal. The second tube 1504 is sealed with the bottom plate 1508 with a hermetic seal. The combination of the first tube 1502 and the second tube 1504 form a hollow cavity 1510 with a changeable volume. The tubes may be ground such that the first tube 1502 and second tube 1504 form a seal to keep the fluid sample within the container.

Figure 16:
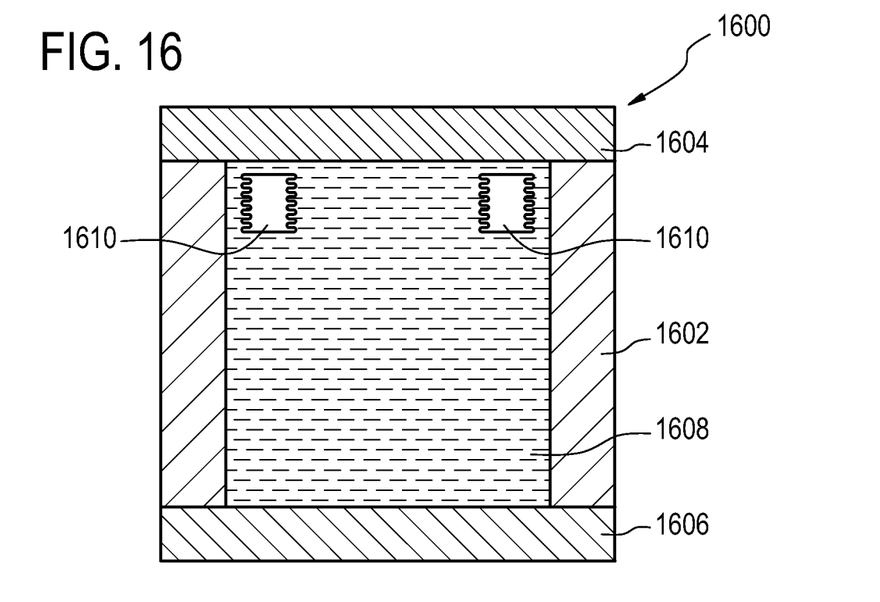
FIG. 16 shows an alternative embodiment of a container according to an embodiment of the invention.

FIG. 16 shows a container 1600 which may be used to construct a magnetic field probe. The container 1600 comprises a tube 1602 which is hermetically sealed with a top plate 1604 and a bottom plate 1606. There is a hollow cavity 1608 filled with a fluorine 19 fluid 1608. Within the hollow cavity 1608 are two bellows 1610 which are there to expand and contract in order to compensate for pressure changes of the sample 1608. A coil or antenna may be attached to the tube 1602 to complete the magnetic field probe.

The bottom plate 1606 may contain the duct and metallization for filling. This is not shown in this Fig. The bellow 1610 may be able to deal with the expansion of the fluid as a function of temperature. The bellows may be connected to the top and/or bottom plates to form hermetic seals. The bellows could also be located a single bellows in a single corner or edge of the hollow cavity.

Figure 17:
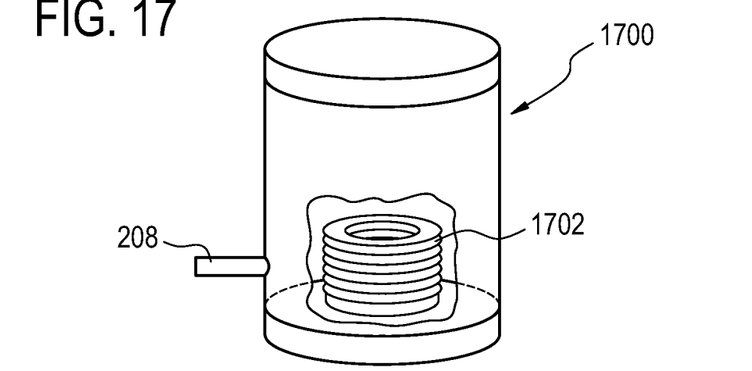
FIG. 17 illustrates a built prototype of a container similar to that show in FIG. 16.

FIG. 17 illustrates a built prototype of a container similar to that show in FIG. 16. In this example there is a container 1700. Within the container contains a bellows 1702. The fluid container has a 9 mm built height and a 5 mm diameter. The bellows 1702 are within the hollow cavity and have a diameter of 2 mm. An optional connector 208 is also shown in this Fig.

Figure 18:
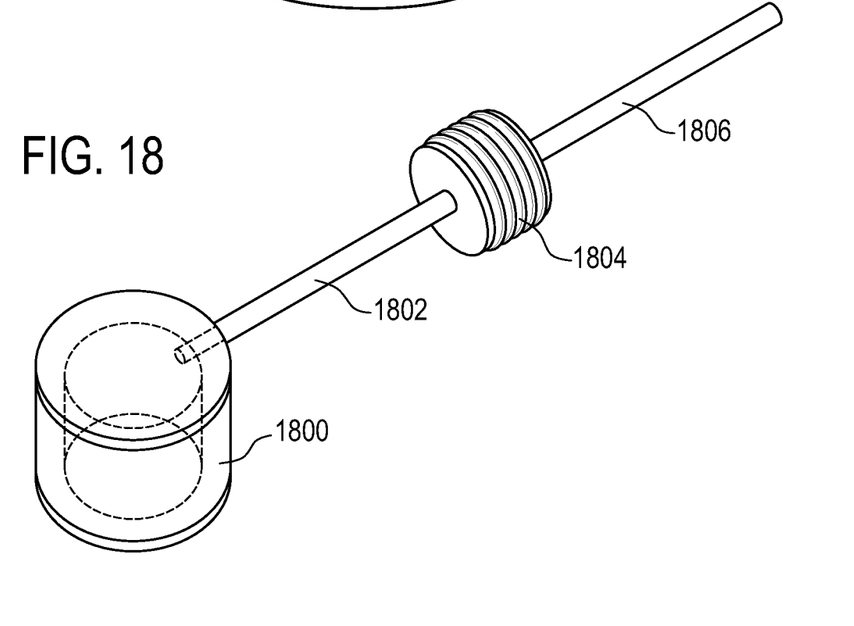
FIG. 18 shows a drawing of a container according to an embodiment of the invention.

FIG. 18 shows a drawing of a container 1800 according to an embodiment of the invention. There is a connector which connects the container 1800 to a bellows 1804. Expansion and contraction of the bellows 1804 allows the fluid within the container 1800 to maintain a constant pressure. The bellows 1804 are connected to an optional tube 1806.

Figure 19:
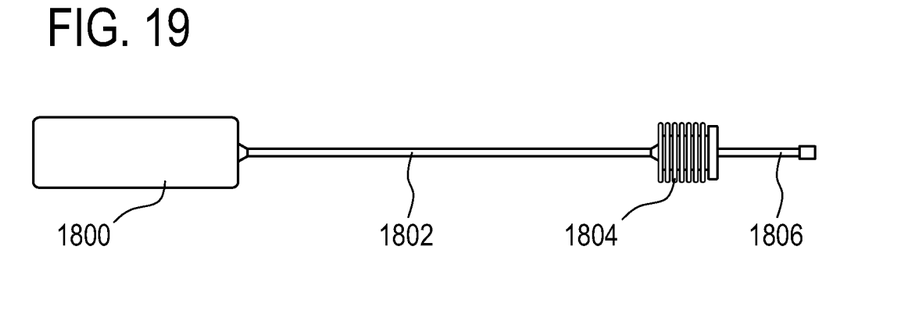
FIG. 19 illustrates a built example of a container similar to that shown in FIG. 18.

FIG. 19 illustrates a built example of an embodiment similar to that shown in FIG. 18.

Figure 20:
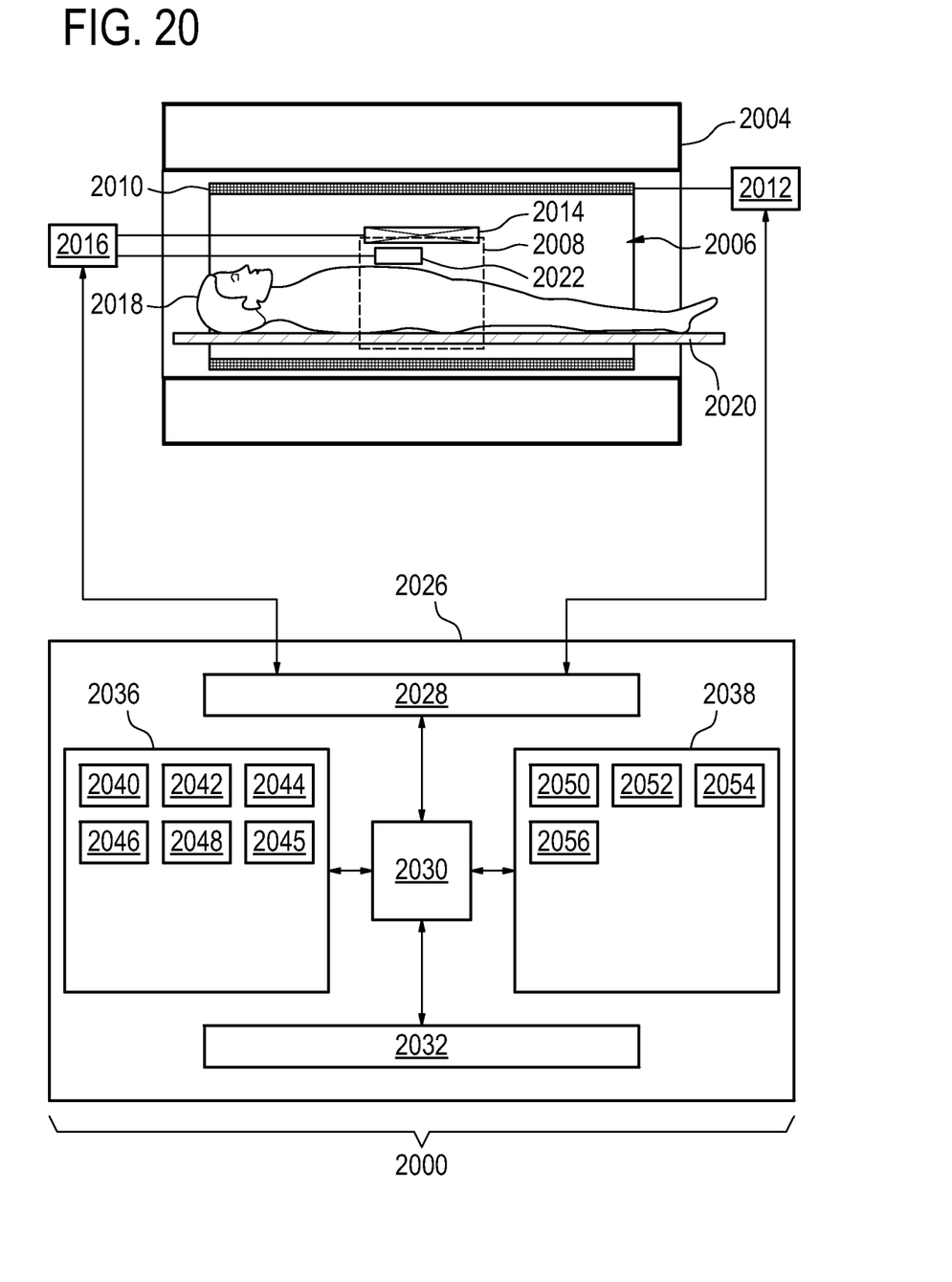
FIG. 20 illustrates an example of a magnetic resonance imaging system according to an embodiment of the invention.

FIG. 20 illustrates an example of a magnetic resonance imaging system 2000 according to an embodiment of the invention. The magnetic resonance imaging system 1000 comprises a magnet 2004. The magnet 2004 is a superconducting cylindrical type magnet 2004 with a bore 2006 through it. The magnet 2004 has a liquid helium cooled cryostat with superconducting coils. It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 2006 of the cylindrical magnet 2004 there is an imaging zone 2008 where the magnetic field is strong and uniform enough to perform magnetic resonance imaging.

Within the bore 2006 of the magnet there is also a set of magnetic field gradient coils 2010 which is used for acquisition of magnetic resonance data to spatially encode magnetic spins, or atomic spins, within the imaging zone 2008 of the magnet 2004. The magnetic field gradient coils 2010 connected to a magnetic field gradient coil power supply 2012. The magnetic field gradient coils 2010 are intended to be representative. Typically magnetic field gradient coils 2010 contain three separate sets of coils for spatially encoding in three orthogonal spatial directions. A magnetic field gradient power supply supplies current to the magnetic field gradient coils. The current supplied to the magnetic field gradient coils 2010 is controlled as a function of time and may be ramped or pulsed.

Adjacent to the imaging zone 2008 is a radio-frequency coil 2014 for manipulating the orientations of magnetic spins, atomic spins, within the imaging zone 2008 and for receiving radio transmissions from spins also within the imaging zone 2008. The radio frequency antenna may contain multiple coil elements. The radio frequency antenna may also be referred to as a channel or antenna. The radio-frequency coil 2014 is connected to a radio frequency transceiver 2016. The radio-frequency coil 2014 and radio frequency transceiver 2016 may be replaced by separate transmit and receive coils and a separate transmitter and receiver. It is understood that the radio-frequency coil 2014 and the radio frequency transceiver 2016 are representative. The radio-frequency coil 2014 is intended to also represent a dedicated transmit antenna and a dedicated receive antenna. Likewise the transceiver 2016 may also represent a separate transmitter and receivers.

A subject 2018 is reposed on a subject support 2020 within the bore 2006 of the magnet 2004. The subject 2018 is partially within the imaging zone 2008. Within the imaging zone 2008 a magnetic field probe 2022 is visible. The magnetic field probe 2022 may also represent multiple field probes. For instance multiple field probes 2022 could be positioned at various locations within the bore 2006 of the magnet 2004. This can enable the spatial temporal measurement of changes in the magnetic field. The field probe or probes 2022 could be mounted in the radio-frequency coil 2014, they could be lying freely on the subject 2018, or they may be mounted within the bore 2006 of the magnet.

The magnetic field gradient coil power supply 2012 and the transceiver 2016 are connected to a hardware interface 2028 of computer system 2026. The computer system 2026 further comprises a processor 2030. The processor 2030 is connected to the hardware interface 2028, a user interface 2034, computer storage 2036, and computer memory 2038.

The computer storage is shown as containing magnetic resonance data 2040 and image magnetic resonance data 2042. The magnetic resonance data 2040, 2042 has been acquired by the magnetic resonance imaging system 2000. The computer storage 2036 is further shown as containing a magnetic field map 2044 which has been reconstructed from the magnetic resonance data 2040. The computer storage 2036 is further shown as containing corrected magnetic resonance data 2045 which has been calculated using the magnetic field map 2044 and the image magnetic resonance data 2042. The computer storage 2036 is further shown as containing an image 2046 which has been reconstructed from the corrected magnetic resonance data 2045. The computer storage 2036 is further shown as containing a pulse sequence 2048. A pulse sequence as used herein is a set of instructions which enables a magnetic resonance imaging system 2000 to acquire magnetic resonance data 2040, 2042.

The computer memory 2038 is shown as containing a control module 2050. The control module 2050 contains machine executable instructions which enable the processor to control the operation and function of the magnetic resonance imaging system 2000. For instance the control module 2050 may use the pulse sequence 2048 to generate commands which enable the processor 330 to acquire the magnetic resonance data 2040, 2042. The computer memory 2038 is further shown as containing a magnetic field calculation module 2052. The magnetic field calculation module 2052 comprises machine executable instructions which enable the processor 2030 to calculate the magnetic field map 2044 from the magnetic resonance data 2040. The computer memory 2038 is further shown as containing a data correction module 2054. The data correction module 2054 contains computer executable code which enables the processor 2030 to calculate the corrected magnetic resonance data 2045 from the magnetic field map 2044 and the image magnetic resonance data 2042. The computer memory 2038 further contains an image reconstruction module 2056. The image reconstruction module 2056 contains computer executable code which enables the processor 2030 to reconstruct the image 2046 from the corrected magnetic resonance data 2045.

Figure 21:
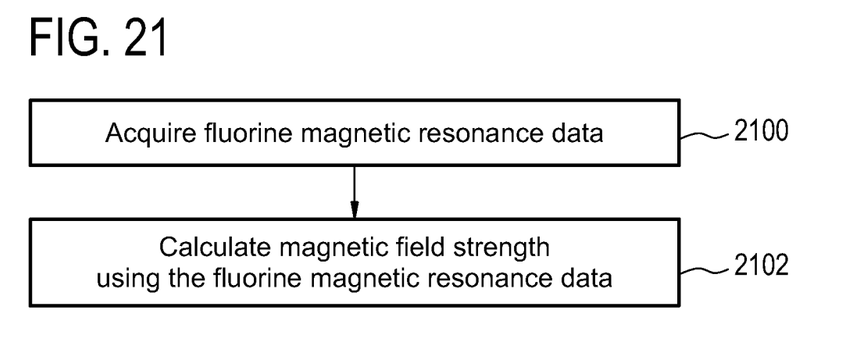
FIG. 21 shows a flow diagram which illustrates a method of operating a magnetic resonance imaging system according to an embodiment of the invention.

FIG. 21 shows a flow chart which illustrates a method according to an embodiment of the invention. In step 2100 magnetic resonance data is acquired. Next in step 2102 a magnetic field strength is calculated using the magnetic resonance data. In some embodiments the fluorine magnetic resonance data is acquired from multiple field probes. In this case the magnetic field strength at multiple spatial positions may be calculated. In addition the magnetic resonance data may be acquired at multiple time periods or continuously through the acquisition of image magnetic resonance data. As such the magnetic field strength may be spatially dependent and/or temporally dependent. That is to say a multi-dimensional magnetic field map which changes as a function of time may also be calculated using the method shown in FIG. 21.

Figure 22:
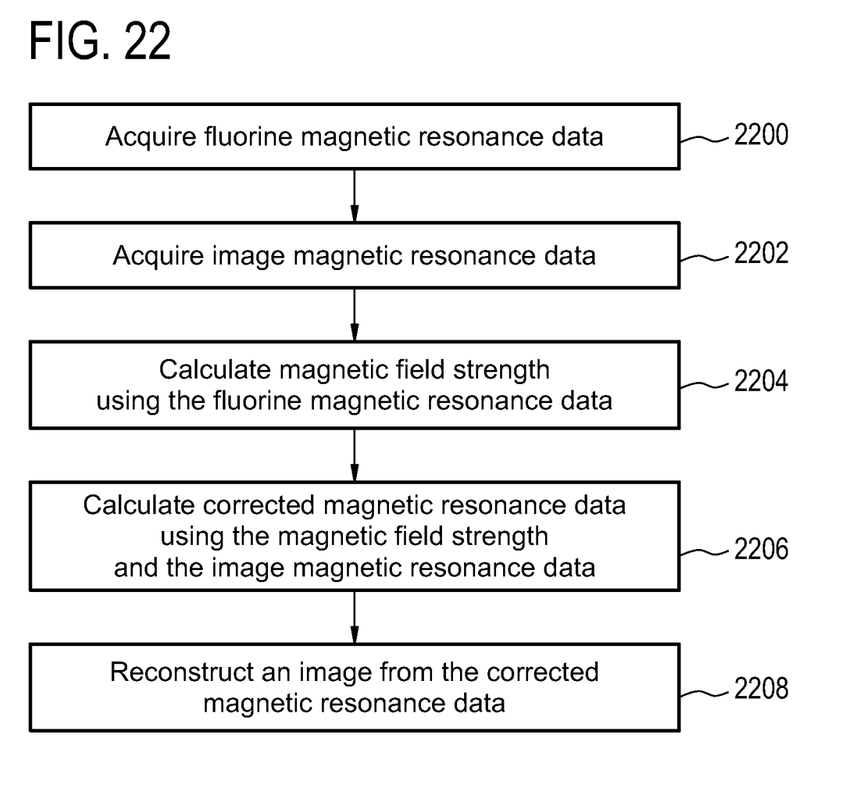
FIG. 22 shows a flow diagram which illustrates a method of operating a magnetic resonance imaging system according to a further embodiment of the invention.

FIG. 22 shows a flow diagram which illustrates a method according to a further embodiment of the invention. In step 2200 magnetic resonance data is acquired. In step 2202 image magnetic resonance data is acquired. Steps 2200 and 2202 may be performed in any order and may also be performed simultaneously. Next in step 2204 a magnetic field strength is calculated using the magnetic resonance data. In some embodiments the magnetic field strength may be calculated before the image magnetic resonance data is acquired. Next in step 2206 corrected magnetic resonance data is calculated using the magnetic field strength and the image magnetic resonance data. Finally in step 2208 an image is reconstructed from the corrected magnetic resonance data. Again, the magnetic resonance data may be acquired from multiple field probes and also at multiple time periods or intervals. As such the corrected magnetic resonance data may be corrected for changes in the magnetic field both in time and in position.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic field probe
102 antenna
104 container
106 hollow cavity
108 metallization
109 exterior surface
110 duct
200 container
202 upper plate
204 lower plate
206 cylinder
208 optional connector
300 fluid sample
302 bubble
304 surface
400 plug
402 seal
500 box
600 container
602 hollow cavity
604 crimped end
700 duct
702 exterior surface
800 metallization
900 fluid sample
1000 plug
1002 seal
1100 bulging wall
1400 container
1402 bellows
1404 place for top plate
1406 bottom plate
1408 hollow cavity
1500 container
1502 first tube
1504 second tube
1506 top plate
1508 bottom plate
1510 hollow cavity
1600 container
1602 tube
1604 top plate
1606 bottom plate
1608 filled hollow cavity
1610 bellows
1800 container
1802 connector
1804 bellows
1806 tube
2000 magnetic resonance imaging system
2004 magnet
2006 bore of magnet
2008 imaging zone
2010 magnetic field gradient coils
2012 magnetic field gradient coil power supply
2014 radio-frequency coil
2016 transceiver
2018 subject
2020 subject support
2022 field probe
2026 computer system
2028 hardware interface
2030 processor
2032 user interface
2034 user interface
2036 computer storage
2038 computer memory
2040 magnetic resonance data
2042 image magnetic resonance data
2044 magnetic field map
2045 corrected magnetic resonance data
2046 image
2048 pulse sequence
2050 control module
2052 magnetic field calculation module
2054 data correction module
2056 image reconstruction module

The invention claimed is:
1. A magnetic field probe comprising:
a container with a hollow cavity, wherein the hollow cavity comprises a duct connecting the hollow cavity with an exterior surface of the container; wherein the container further comprises metallization surrounding the duct on the exterior surface, wherein the container further comprises a metallic plug, wherein the metallic plug at least partially fills the duct, wherein the metallic plug forms a seal with the metallization;

a fluid sample comprising an atomic species with a nuclear spin, wherein the sample at least partially fills the hollow cavity;

an antenna adjacent to the container for manipulating the magnetic spins of the fluid sample and for receiving magnetic resonance signals from the fluid sample.

2. The magnetic field probe of claim 1, wherein the container is a rigid container.

3. The magnetic field probe of claim 2, wherein the hollow cavity contains a bubble in the sample for relieving expansion and contraction of the fluid sample.

4. The magnetic field probe of claim 3, wherein a portion of the hollow cavity is coated with a coating for maintaining a preferred bubble location of the bubble.

5. The magnetic field probe of claim 2, wherein the container comprises a bellows at least partially within the hollow cavity for relieving thermal expansion and contraction of the fluid sample.

6. The magnetic field probe of claim 1, wherein at least a portion of the container forming the hollow cavity comprises at least one flexible element for relieving expansion and contraction of the fluid sample.

7. The magnetic field probe of claim 6, wherein the flexible element is a bellows.

8. The magnetic field probe of claim 1, wherein the atomic species is any one of the following: Hydrogen, Deuterium, and Fluorine 19.

9. The magnetic field probe of claim 1, wherein the atomic species is Fluorine 19, wherein the sample comprises any one of the following: a perfluorinated hydrocarbon; perfluoropinacol; triflate; hexafluorobenzene; hexafluoro-2,3-bis(trifluoromethyl)butane-2,3-diol; hexafluoro-2-propanol; 2,2,2-trifluoroethanol; 3,3,3-trifluoro-1-propanol; trifluoroacetic acid; hexafluorobenzene; perfluoro 15-crown-5; at least one dopant admixed to the MR active substance, the dopant being a complex of a divalent or trivalent metal cation with two or three equivalents, respectively, of a charge neutralizing ligand, wherein said ligand is selected from the group consisting of: acetylacetonate, 6,6,7,7,8,8,8-heptafluoro-2,2-dimethyl-3,5-octanedionate, hexafluoroacetylacetonate, acetate, tetramethylcyclopentadienyl propoxide, and 2,2,6,6-tetramethyl-5 3,5-heptanedionate, wherein said metal cation is selected from the group consisting of Fe, Mn, Cr, Co, Ni, Cu or anyone of the rare earth metals; a fluorine-containing, room-temperature ionic liquid; a fluorine-containing ioinic liquid in which the anion is tetrafluoroborate, hexafluorophosphate, tetrafluoroaluminate, hexafluoroantimonate, hexafluoroarsenate, bis(trifluoromethane)sulfonimide, tris(trifluoromethylsulfonyl)methide, or triflate; and combinations thereof.

10. The magnetic field probe of claim 9, wherein the metallic plug comprises any one of the following: gold, indium, platinum, palladium, and combinations thereof.

11. A magnetic resonance imaging system comprising a magnet for providing an imaging zone, wherein the magnetic resonance imaging system further comprises a radio-frequency transceiver, wherein the magnetic resonance imaging system further comprises a magnetic field probe according to claim 10, wherein the field probe is connected to the radio-frequency transceiver, and wherein the field probe is located within the imaging zone.

12. The magnetic resonance imaging system of claim 10, wherein the magnetic resonance imaging system further comprises a processor for controlling the magnetic resonance imaging system, wherein the magnetic resonance imaging system further comprises a memory for storing machine executable instructions, wherein execution of the instructions causes the processor to:

acquire magnetic resonance data using the magnetic resonance imaging system; and calculate a magnetic field strength using the magnetic resonance data.

13. A method of manufacturing a magnetic field probe, wherein the method comprises the steps of:

providing a container with a hollow cavity, wherein the hollow cavity comprises a duct connecting the hollow cavity with an exterior surface of the container; wherein the container further comprises metallization surrounding the duct on the exterior surface;

filling the hollow cavity at least partially with a fluid sample comprising an atomic species with a nuclear spin, wherein the container comprises an antenna adjacent to the container for manipulating the magnetic spins of the sample and for receiving magnetic resonance signals from the fluid sample; and filling the duct at least partially with a metallic plug, wherein the metallic plug forms a seal with the metallization.

14. The method of claim 13, wherein the seal between the metallic plug and the metallization is formed using thermosonic bonding.

15. The method of claim 13, wherein the hollow cavity is filled by performing the steps of:

placing the container in a vacuum;

submersing the duct in the fluid sample; and venting the vacuum to atmospheric pressure, wherein the duct is filled with the metallic plug after venting the vacuum.

* * * * *